United States Patent
Trzaskowski et al.

(10) Patent No.: US 6,189,201 B1
(45) Date of Patent: Feb. 20, 2001

(54) METHOD OF TUNING A HIGH FREQUENCY PRINTED RESONANCE CIRCUIT

(75) Inventors: Czeslaw Trzaskowski, Grafitowa; Henryk Krzemieniewski, Bartag, both of (PL)

(73) Assignee: Sino Dragon Inc., Taichung (TW)

( * ) Notice: Under 35 U.S.C. 154(b), the term of this patent shall be extended for 0 days.

(21) Appl. No.: 09/271,983

(22) Filed: Mar. 19, 1999

(51) Int. Cl.[7] ................................. H01F 7/06; B24B 7/00
(52) U.S. Cl. ............................. 29/602.1; 29/593; 29/835; 29/847; 29/853; 451/120; 451/178; 451/541; 451/548
(58) Field of Search .................... 29/602.1, 835, 29/847, 853, 761, 593, DIG. 26, 852; 451/120, 178, 278, 29, 541, 548

(56) References Cited

U.S. PATENT DOCUMENTS

| Re. 29,284 | * | 6/1977 | Shaheen et al. | 29/847 |
|---|---|---|---|---|
| 3,508,457 | * | 4/1970 | Ogston | 29/602.1 |
| 3,594,679 | * | 7/1971 | Seay et al. | 29/602.1 |
| 3,766,639 | * | 10/1973 | Parr et al. | 29/593 |
| 4,369,557 | * | 1/1983 | Vanderbuilt | 29/602.1 |
| 4,769,883 | * | 9/1988 | Nathanson et al. | 29/602.1 |
| 5,065,123 | * | 11/1991 | Heckaman et al. | 333/246 |
| 5,074,037 | * | 12/1991 | Sutcliffe et al. | 29/593 |
| 5,619,140 | * | 4/1997 | Brey et al. | 29/593 |

FOREIGN PATENT DOCUMENTS 59-134809 * 8/1984 (JP) .................................. 29/602.1

OTHER PUBLICATIONS

Langen et al, a Micro–EDM/assembly System Unit for Microparts Fabrication, Emerging Technologies and factory Automation, 1993 IEEE 2nd International Workshop, pp. 229–237, Sep. 1993.*

Chang et al, Fine Line Thin Dielectric Circuit Board Characterization, IEEE, Electronic Components and Technology Converence, Proceedings 44th, pp. 564–569, May 1994.*

* cited by examiner

Primary Examiner—Lee Young
Assistant Examiner—A. Dexter Tugbang
(74) Attorney, Agent, or Firm—Finnegan, Henderson, Farabow, Garrett & Dunner, L.L.P.

(57) ABSTRACT

In a method of tuning a high frequency printed resonance circuit having a conductive layer that is printed on a dielectric substrate and that serves as an inductance of the resonance circuit, the conductive layer is ground to mechanically remove a portion thereof from the dielectric substrate via a grinding pin that is rotated about a rotary axis perpendicular to a major printed surface of the dielectric substrate, thereby correcting the inductance of the resonance circuit in order to tune the same.

3 Claims, 1 Drawing Sheet

METHOD OF TUNING A HIGH FREQUENCY PRINTED RESONANCE CIRCUIT

BACKGROUND OF THE INVENTION

1. Field of the Invention

The invention relates to printed resonance circuits, more particularly to a method of tuning a high frequency printed resonance circuit.

2. Description of the Related Art

High frequency printed resonance circuits are generally employed in radio devices, such as transmitters and receivers, filters, etc. Presently, there are two known methods of tuning a printed resonance circuit. The first method involves cutting of a conductive layer, which serves as the inductance of the resonance circuit, to change the length or geometry of the same, thereby mechanically correcting the circuit inductance. The second method involves laser burning of the conductive layer. The first method is inaccurate and troublesome. Although the second method is more accurate and more convenient to use than the first method, the second method requires a high temperature resistant dielectric substrate material, such as ceramic materials, for the resonance circuit. Application of the second method on resonance circuits printed on other widespread dielectric substrate materials, such as composite or glass-epoxy, is impossible.

SUMMARY OF THE INVENTION

Therefore, the object of the present invention is to provide a method of tuning a high frequency printed resonance circuit that can be applied to most widespread dielectric substrate materials.

According to the present invention, a method of tuning a high frequency printed resonance circuit having a conductive layer that is printed on a dielectric substrate and that serves as an inductance of the resonance circuit, comprises the step of grinding the conductive layer to mechanically remove a portion thereof from the dielectric substrate via a grinding pin that is rotated about a rotary axis perpendicular to a major printed surface of the dielectric substrate, thereby correcting the inductance of the resonance circuit and tuning the resonance circuit.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
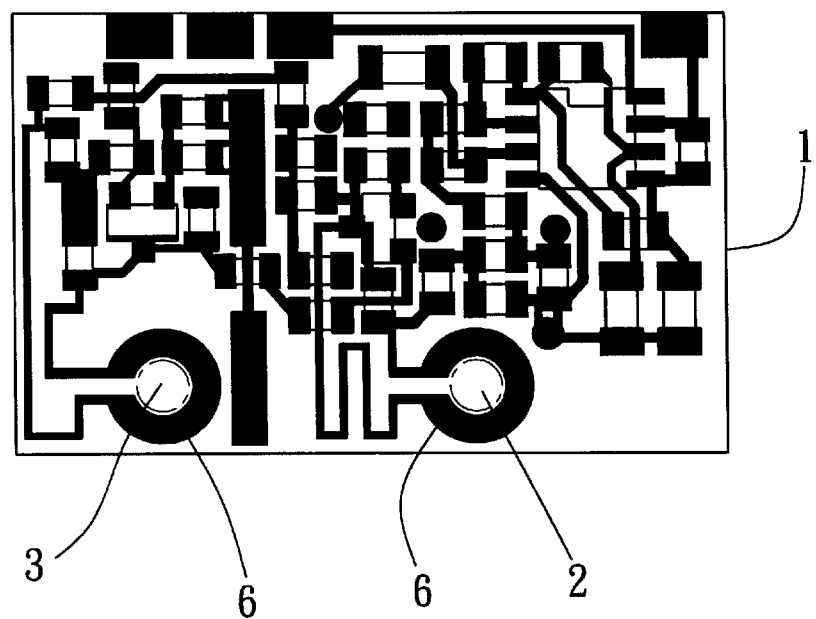
FIG. 1 is a schematic top view of a printed resonance circuit that is to be tuned in accordance with the preferred embodiment of this invention.

Referring to FIG. 1, a radio receiver has a resonance circuit with a conductive layer 6 that is printed on a dielectric substrate 1, such as a glass-epoxy substrate, and that serves as an inductance of the resonance circuit. In the example of FIG. 1, the radio receiver has two resonance circuits. A hole 2, 3 is formed in the conductive layer 6 of each resonance circuit and through the dielectric substrate 1.

Figure 2:
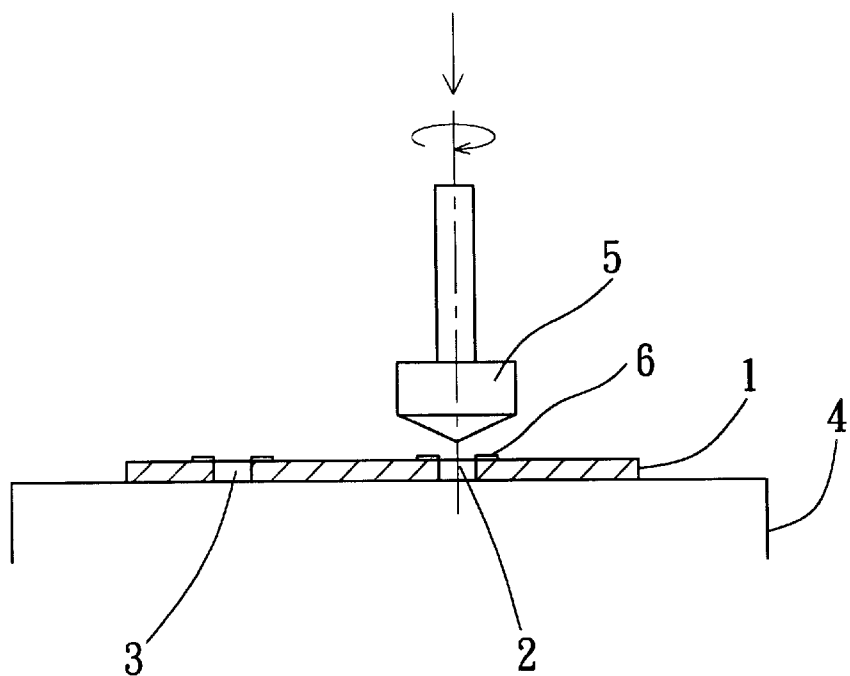
FIG. 2 is a schematic side view illustrating the preferred embodiment of a method of tuning a high frequency printed resonance circuit in accordance with the present invention.

Referring to FIG. 2, in the circuit tuning method of the preferred embodiment, the dielectric substrate 1 is initially mounted on an operating table 4. After the resonance circuit to be tuned is connected to a tester (not shown), a grinding pin 5 set to rotate about a rotary axis that is perpendicular to a major printed surface of the dielectric substrate 1 is brought toward the operating table 4 with the rotary axis registering with the hole 2 so as to enable the grinding pin 5 to mechanically remove a portion of the conductive layer 6 at a periphery of the hole 2 by grinding, thereby correcting the inductance of the resonance circuit to tune the latter. The hole 2 thus simplifies the grinding operation during the tuning process. The change in the inductance of the resonance circuit is monitored via the tester during the grinding of the conductive layer 6. Upon detection that a desired inductance parameter has been achieved, grinding of the conductive layer 6 is terminated to complete tuning of the resonance circuit. The next resonance circuit can be tuned by repeating the above steps.

The method of tuning printed resonance circuits according to the present invention can be applied to most widespread dielectric substrate materials. As compared to the conventional cutting and laser burning methods described beforehand, the method of the present invention is easier and cheaper to implement, and does not require the use of special tools and equipment. In addition to its simplicity, the method of the present invention is also precise. The range of tuning depends on the expectation of the designer and on the diameter of the grinding pin that is in use. The characteristic of tuning depends on the shape of the grinding pin. The method of the present invention permits the elimination of expensive tuning components, such as trimmer capacitors and tuned filters, from an electrical circuit. Thus, the electrical circuit can be made simpler and more resistant to bad working conditions, such as humidity, vibrations, etc., which is important in various portable devices.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method of correcting inductance of an inductive element in a high frequency printed resonance circuit, the inductive element being formed as a generally annular-shaped conductive layer that is printed on a major surface of a dielectric substrate, and having an inner edge defined by a periphery of a hole formed through the conductive layer and the dielectric substrate, said method comprising the steps of:

registering a grinding pin with the hole;

rotating the grinding pin about a rotational axis perpendicular to the major surface of the dielectric substrate;

grinding the inductive element to mechanically remove a portion of the inner edge thereof at the periphery of the hole by movement of the grinding pin;

monitoring change in the inductance of the inductive element during said step of grinding the conductive layer; and terminating said step of grinding the conductive layer upon detection of a desired inductance.

2. The method of claim 1, further comprising the step of mounting the dielectric substrate on an operating table before commencement of said grinding step.

3. The method of claim 2, wherein the grinding pin is moved toward the operating table during said grinding step.

* * * * *